(12) United States Patent
Shimazawa

(10) Patent No.: US 8,098,464 B2
(45) Date of Patent: Jan. 17, 2012

(54) CPP-TYPE MAGNETO RESISTANCE ELEMENT HAVING A PAIR OF FREE LAYERS AND SPACER LAYER SANDWICHED THEREBETWEEN

(75) Inventor: Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 1003 days.

(21) Appl. No.: 12/033,257

(22) Filed: Feb. 19, 2008

(65) Prior Publication Data

US 2009/0207533 A1 Aug. 20, 2009

(51) Int. Cl.
*G11B 5/39* (2006.01)

(52) U.S. Cl. .............................. 360/324.12; 360/324.2

(58) Field of Classification Search ............. 360/324.11, 360/324.12, 324.2
See application file for complete search history.

(56) References Cited

U.S. PATENT DOCUMENTS 7,019,371 B2   3/2006   Seigler
7,881,023 B2 *   2/2011   Machita et al. .......... 360/324.12

FOREIGN PATENT DOCUMENTS

| JP | 2002-171013 | 6/2002 |
|---|---|---|
| JP | 2002-252394 | 9/2002 |
| JP | 2005-44489 | 2/2005 |
| JP | 2007-80904 | 3/2007 |

* cited by examiner

*Primary Examiner* — Allen Heinz
(74) *Attorney, Agent, or Firm* — Knobbe Martens Olson & Bear LLP

(57) ABSTRACT

A magnetic field detecting element includes: first and second free layers; a spacer layer; a first exchange coupling transmitting layer; a first pinned layer; a second exchange coupling transmitting layer; and a second pinned layer. The first and second pinned layers are magnetized in directions which are perpendicular to an air bearing surface and which are antiparallel with each other, respectively. The first exchange coupling transmitting layer or second exchange coupling transmitting layer has a positive exchange coupling strength, while the other has a negative exchange coupling strength. The first or second pinned layer that is located adjacent to the first or second exchange coupling transmitting layer having the negative exchange coupling strength has a larger magnetic film thickness than the first or second free layer that is located adjacent to the first or second exchange coupling transmitting layer having the negative exchange coupling strength.

11 Claims, 11 Drawing Sheets

Fig.1A
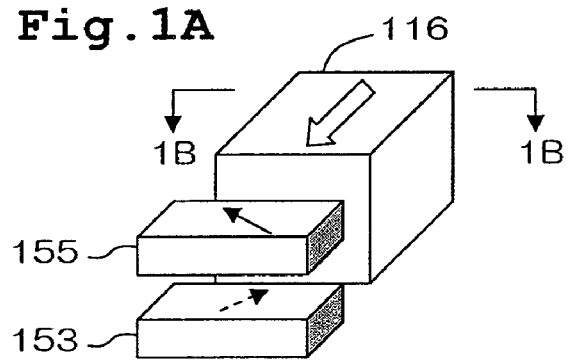
Conventional Art
Fig.1B
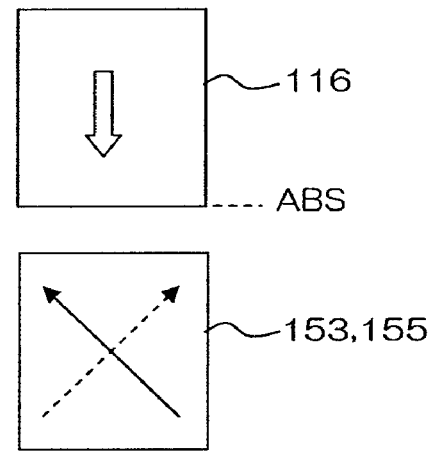
Conventional Art
Fig.1C
Fig.1D
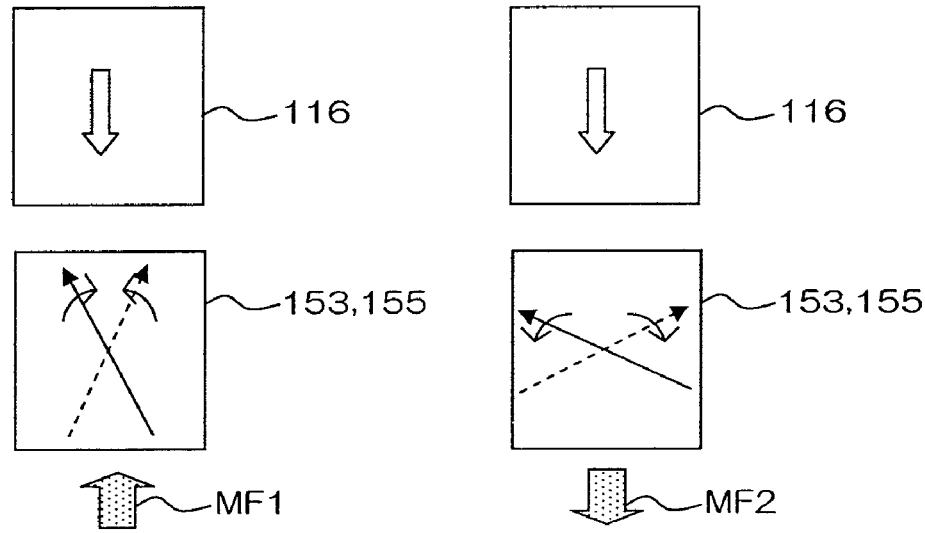
Conventional Art   Conventional Art

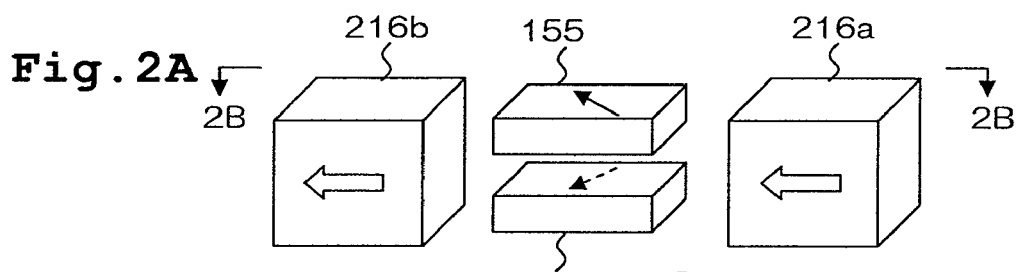
Fig. 2A — Conventional Art
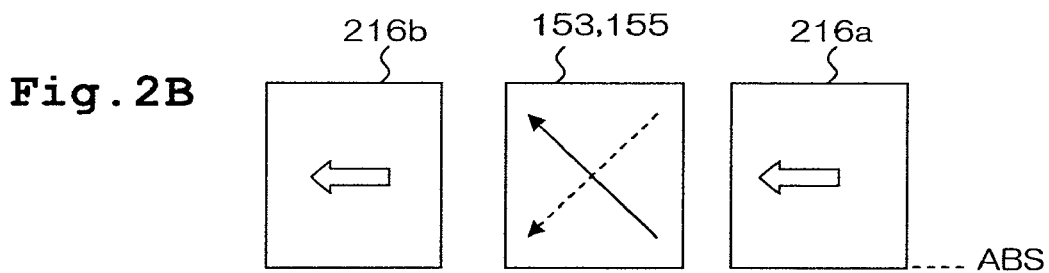
Fig. 2B — Conventional Art
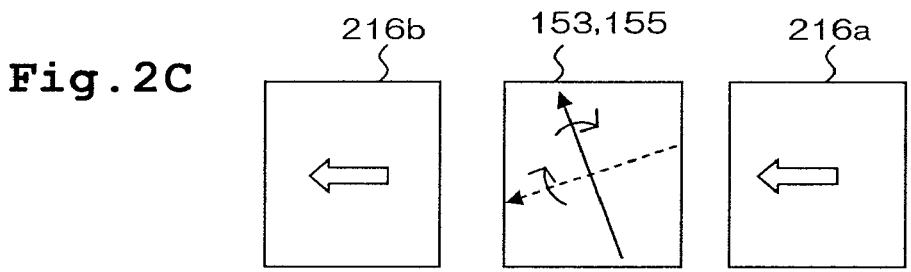
Fig. 2C — Conventional Art
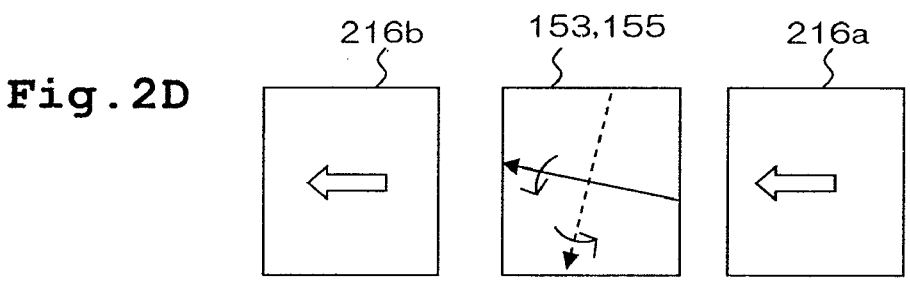
Fig. 2D — Conventional Art

CPP-TYPE MAGNETO RESISTANCE ELEMENT HAVING A PAIR OF FREE LAYERS AND SPACER LAYER SANDWICHED THEREBETWEEN

BACKGROUND OF THE INVENTION

1. Field of the Invention

The present invention relates to a magnetic field detecting element, and more particularly, to the element structure of a magnetic field detecting element having a pair of free layers.

2. Description of the Related Art

A GMR (Giant Magneto-Resistance) element is known as a reproducing element (magnetic field detecting element) of a thin film magnetic head. Hitherto, CIP (Current in Plane)-GMR element, in which sense current flows in a direction that is horizontal to the film surface of the element, have been mainly used. In recent years, however, in order to realize higher recording density, elements have been developed in which sense current flows in a direction that is perpendicular to the film surface of the element. TMR elements utilizing the TMR (Tunnel Magneto-Resistance) effect and CPP (Current Perpendicular to the Plane) elements utilizing the GMR effect are known as elements of this type. In this specification, an element in which sense current flows in a direction that is perpendicular to the film surface of the element is generally referred to as a CPP-type element.

Conventionally, the CPP element includes a stack having a magnetic layer (free layer) whose magnetization direction changes in accordance with an external magnetic field, a magnetic layer (pinned layer) whose magnetization direction is fixed with respect to the external magnetic field, and a non-magnetic intermediate layer sandwiched between the pinned layer and the free layer. As a pinned layer, a so-called synthetic pinned layer, in which two magnetic layers are antiferromagnetically coupled to each other, is generally used, and an antiferromagnetic layer is provided adjacent to the synthetic pinned layer. On both sides of the stack with regard to the track width direction thereof, bias magnetic layers for applying a bias magnetic field to the free layer are provided. The free layer is magnetized into a single magnetic domain by a bias magnetic field that is emitted from the bias magnetic layers. This provides an improvement in linear change in resistance with respect to a change in an external magnetic field and an effective reduction in Barkhausen noise. The relative angle formed between the magnetization direction of the free layer and the magnetization direction of the pinned layer changes in accordance with an external magnetic field, and as a result, electric resistance of sense current that flows in a direction that is perpendicular to the film surface of the stack is changed. By making use of this property, external magnetization is detected.

In recent years, higher linear recording density is desired. However, an improvement in linear recording density requires a reduction in spacing between upper and lower shield layers (a gap between shields). In recent years, novel film configurations that are completely different from conventional stacks and that have a potential to meet this requirement have been proposed. U.S. Pat. No. 7,019,371 discloses a CIP element having two free layers whose magnetization directions vary in accordance with an external magnetic field and a non-magnetic spacer layer sandwiched therebetween. U.S. Pat. No. 7,035,062 discloses a CPP-GMR element having two free layers whose magnetization directions vary in accordance with an external magnetic field and a non-magnetic spacer layer sandwiched therebetween. In these elements, the two free layers are exchange-coupled with each other due to the RKKY (Rudermann, Kittel, Kasuya, Yoshida) interaction that occurs via the non-magnetic spacer layer. A bias magnetic layer is disposed on the back side of the stack, as viewed from the air bearing surface, and applies a bias magnetic field in the direction that is perpendicular to the air bearing surface. The magnetization directions of the two free layers form a certain relative angle due to the magnetic field that is applied from the bias magnetic layer. When an external magnetic field is applied in the direction that is perpendicular to the air bearing surface from a recording medium in this state, the magnetization directions of the two free layers are changed, and as a result, the relative angle formed by the two free layers is also changed, and thereby, the electrical resistance of the sense current is changed. These properties enable detection of external magnetization. In this way, the film configuration using two free layers, which does not require a conventional synthetic pinned layer and an antiferromagnetic layer, has a simple film configuration, and has potential for reducing the shield gap.

The reason why the bias magnetic layer is provided on the back side of the stack, as viewed from the air bearing surface, in a magnetic field detecting element that uses two free layers described above is as follows: FIG. 1A is a conceptual view of the above-described magnetic field detecting element having two free layers. In FIGS. 1A to 2D which will be referred to below, only layers that are necessary for explanation are depicted. Bias magnetic layer 116 is provided on the back side of free layers 153, 155, as viewed from the air bearing surface. The arrows on free layers 153, 155 indicate the magnetization directions of the respective free layers (The broken line and the solid line indicate the magnetization direction of free layer 153 and the magnetization direction of free layer 155, respectively.). The arrow on bias magnetic layer 116 indicates the direction of a bias magnetic field. FIG. 1B is a top view of the magnetic field detecting element shown in FIG. 1A, as viewed from direction 1B-1B in FIG. 1A. Two free layers 153, 155 are exchange-coupled to each other via a non-magnetic spacer layer (not shown) sandwiched therebetween. By appropriately setting the magnitude of the bias magnetic field applied from bias magnetic layer 116, two free layers 153, 155 are magnetized such that the magnetization directions thereof form right angles while being exchange-coupled to each other. It should be noted that this magnetization state requires two free layers 153, 155 to be exchange-coupled to each other such that the magnetization directions thereof are anti-parallel with each other, i.e., exchange-coupled by a negative exchange coupling force. In the present description, "parallel" means that magnetization directions are parallel with each other and are directed in the same direction, while "anti-parallel" means that magnetization directions are parallel with each other but are directed in opposite directions.

When external magnetic field MF1 that is directed from air bearing surface ABS toward the magnetic field detecting element is applied in this state, as shown in FIG. 1C, the magnetization directions of two free layers 153, 155 are rotated toward the direction of external magnetic field MF1. As will be apparent from the figure, the magnetization directions of two free layers 153, 155 are rotated in directions that are opposite to each other so that the relative angle formed by the magnetization directions of the layers decreases as if a pair of scissors was closed. This results in a decrease in electrical resistance to the sense current. Since two free layers 153, 155 are exchange-coupled to each other, the relative angle formed by the magnetization directions of two free layers 153, 155 is a function of the exchange coupling force and the magnitude of the external magnetic field. When external magnetic field MF2 that is directed away from the magnetic field detecting element is applied in the same manner, as shown in FIG. 1D, the relative angle formed by the magnetization directions of two free layers 153, 155 increases as if a pair of scissors was opened, unlike the case of FIG. 1C. This results in an increase in electrical resistance to the sense current. In this way, electrical resistance to the sense current changes in accordance with the direction and the magnitude of the external magnetic field, and the external magnetic field can be detected.

Next, FIG. 2A is a conceptual view showing a magnetic field detecting element that includes two free layers, which are the same as the ones in FIG. 1A, and bias magnetic layers that are provided on both sides of the free layers, as viewed in the track width direction. FIG. 2B is a top view of the magnetic field detecting element shown in FIG. 2A, as viewed in direction 2B-2B in FIG. 2A. Two free layers 153, 155 are exchange-coupled to each other via a non-magnetic spacer layer (not shown) that is sandwiched therebetween. By appropriately setting the magnitude of a bias magnetic field that is applied from bias magnetic layers 216a, 216b, two free layers 153, 155 are magnetized such that the magnetization directions form substantially right angles, while being exchange-coupled to each other.

When external magnetic field MF1 that is directed from air bearing surface ABS toward the magnetic field detecting element is applied in this state, as shown in FIG. 2C, the magnetization directions of two free layers 153, 155 are rotated toward the direction of external magnetic field MF1. However, the magnetization directions of two free layers 153, 155 remain perpendicular to each other. This is because the magnetization directions of two free layers 153, 155 are rotated in the same direction in this case, and hence, no force to overcome the exchange coupling force and thereby to change the relative angle between the magnetization directions of two free layers 153, 155 is produced. For this reason, the relative angle formed by the magnetization directions of two free layers 153, 155 changes little even when external magnetic field MF1 is applied, and accordingly, a sufficient change in magnetoresistance cannot be obtained. Similarly, when external magnetic field MF2 that is directed away from the magnetic field detecting element is applied, as shown in FIG. 2D, the state in which the magnetization directions are perpendicular to each other is kept as it is. Therefore, the relative angle that is formed by the magnetization directions of two free layers 153, 155 changes little even when external magnetic field MF2 is applied, and accordingly, a sufficient change in magnetoresistance cannot be obtained.

For the reasons stated above, a magnetic field detecting element having two free layers is provided with a bias magnetic layer on the back side of the stack, as viewed from the air bearing surface. However, this arrangement is disadvantageous in that a bias magnetic field cannot be effectively applied to the free layers because this arrangement allows only one bias magnetic layer. The bias magnetic field can be effectively applied by providing a pair of bias magnetic layers on both sides of the free layers in order to concentrate a sufficient amount of magnetic field on the free layers without divergence. However, it is impossible to provide a bias magnetic layer on the side of the air bearing surface side, and no fundamental solution has been found.

SUMMARY OF THE INVENTION

The present invention is directed to a magnetic field detecting element having two free layers whose magnetization directions change in accordance with an external magnetic field. An object of the present invention is to provide a magnetic field detecting element which has bias magnetic layers on both sides of the free layers with regard to the track width direction, so that a sufficient amount of bias magnetic field can be applied and thereby linear change in resistance is enhanced and the Barkhousen noise is effectively limited.

According to an embodiment of the present invention, a magnetic field detecting element comprises: first and second free layers whose magnetization directions change in accordance with an external magnetic field; a spacer layer that is sandwiched between the first and second free layers; a first exchange coupling transmitting layer that is located adjacent to a surface of first free layer, the surface of first free layer 53 being opposite to a surface of the first free layer which is located adjacent to the spacer layer; a first pinned layer which is provided such that the first pinned layer and the first free layer sandwich the first exchange coupling transmitting layer and which is exchange-coupled to first free layer via the first exchange coupling transmitting layer; a second exchange coupling transmitting layer that is located adjacent to a surface of the second free layer, the surface of the second free layer being opposite to a surface of the second free layer which is located adjacent to the spacer layer; a second pinned layer which is provided such that the second pinned layer and the second free layer sandwich the second exchange coupling transmitting layer and which is exchange-coupled to the second free layer via the second exchange coupling transmitting layer; and a pair of bias magnetic layers which are provided on both sides of at least the first and second free layers with regard to a track width direction thereof, the pair of bias magnetic layers applying a bias magnetic field to the first and second free layers. The first and second pinned layers are magnetized in directions which are perpendicular to an air bearing surface and which are anti-parallel with each other, respectively. The first exchange coupling transmitting layer or second exchange coupling transmitting layer has a positive exchange coupling strength, while the other has a negative exchange coupling strength. The first or second pinned layer that is located adjacent to the first or second exchange coupling transmitting layer having the negative exchange coupling strength has a larger magnetic film thickness than the first or second free layer that is located adjacent to the first or second exchange coupling transmitting layer having the negative exchange coupling strength.

In a magnetic field detecting element having such an arrangement, the first free layer and the first pinned layer are magnetized in parallel or in directions that are anti-parallel to each other under a hypothetical condition in which no bias magnetic field is applied. Similarly, the second free layer and the second pinned layer are magnetized in parallel or in directions that are anti-parallel to each other. Whether the magnetization directions are in parallel or in anti-parallel depends on whether the exchange coupling strengths of the first and second exchange coupling transmitting layers are positive or negative. For example, if the first exchange coupling transmitting layer has a positive exchange coupling strength and the second exchange coupling transmitting layer has a negative exchange coupling strength, then the first free layer and the first pinned layer are magnetized in parallel with each other and the second free layer and the second pinned layer are magnetized in directions that are anti-parallel to each other. Since the first and second pinned layers are magnetized in directions that are anti-parallel to each other, the first and second free layers are magnetized in the same direction. This magnetization direction corresponds to the direction that is perpendicular to the air bearing surface because the first and second pinned layers are magnetized in directions that are perpendicular to the air bearing surface.

Next, suppose a state in which a bias magnetic field is applied under this hypothetical condition. For example, when the first free layer and the first pinned layer are magnetized in parallel with each other, both the first free layer and the first pinned layer are magnetized in the direction of the bias magnetic field. However, the second free layer and the second pinned layer are magnetized differently from the first free layer and the first pinned layer because the second free layer and the second pinned layer are magnetized in opposite directions. Specifically, the second pinned layer, which has a larger magnetic film thickness than the second free layer, is magnetized in the direction of the bias magnetic field, while being accompanied by the second free layer that is exchange-coupled to the second pinned layer. However, as concerns the relation between the second free layer and the second pinned layer, the second free layer is magnetized in a direction that is anti-parallel to the second pinned layer because the second free layer is exchange-coupled to the second pinned layer via a negative exchange coupling strength. In other words, the second pinned layer and the second free layer are magnetized in the direction of the bias magnetic field as a unit, but the second free layer is magnetized in a direction that is anti-parallel to the second pinned layer within the unit. As a result, the second pinned layer is magnetized in the direction opposite to the direction of the bias magnetic field.

In this way, the first and second free layers which are subjected to the bias magnetic field are magnetized in mirror-symmetric directions with respect to the direction that is perpendicular to the air bearing surface. This state corresponds to the magnetization state in which the first and second free layers would be under no external magnetic field, as described above with reference to FIG. 1B. Therefore, when the external magnetic field is applied, the relative angle that is formed by the magnetization directions of the first and second free layers changes as if a pair of scissors was opened and closed, thereby a large change in magnetoresistance can be obtained. Moreover, the bias magnetic layers, which are provided on both sides of the first and second free layers with regard to the track width direction, allow the bias magnetic field to be effectively applied.

Accordingly, it is possible to provide a magnetic field detecting element which has the above-described film configuration and which is capable of applying a sufficient amount of bias magnetic field and thereby capable of enhancing linear change in resistance and effectively limiting the Barkhousen noise

BRIEF DESCRIPTION OF THE DRAWINGS

FIGS. 1A to 1D are schematic conceptual views illustrating magnetization of free layers in a conventional magnetic field detecting element having two free layers, in which a bias magnetic layer is provided on the back side of the free layers, as viewed from the air bearing surface;

FIGS. 2A to 2D are schematic conceptual views illustrating magnetization of free layers in a conventional magnetic field detecting element having two free layers, in which bias magnetic layers are provided on both sides with regard to the track width direction;

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 3:
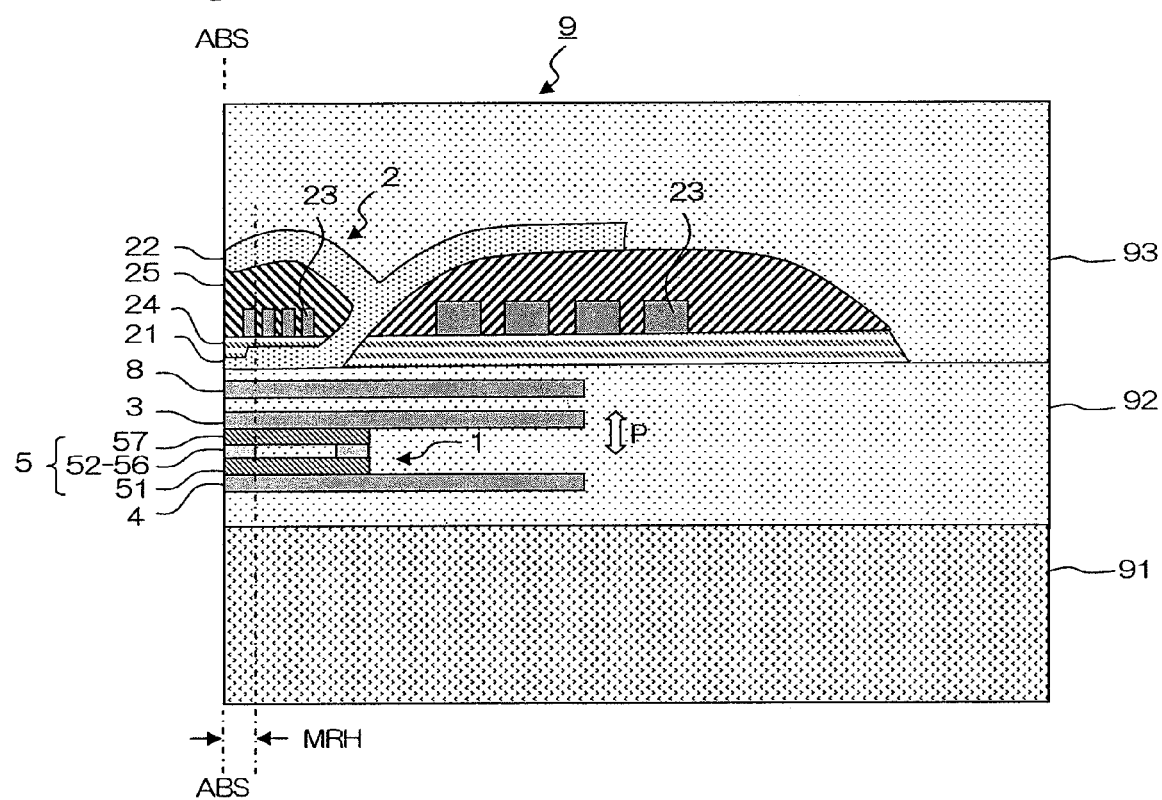
FIG. 3 is a conceptual sectional view illustrating a thin film magnetic head including a magnetic field detecting element according to an embodiment of the present invention.
Figure 4:
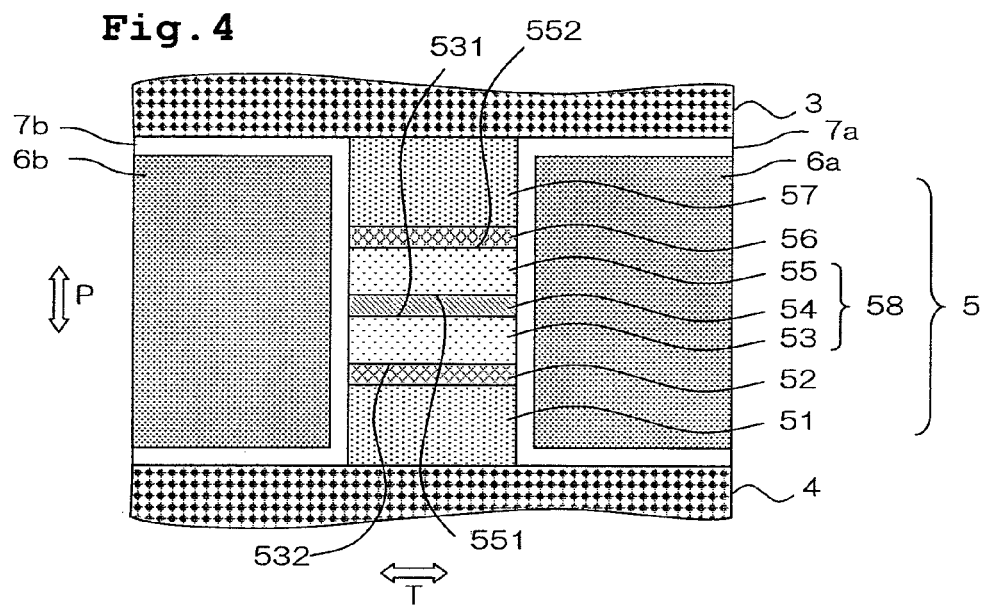
FIG. 4 is a partial enlarged view illustrating the air bearing surface of the magnetic field detecting element shown in FIG. 3.

An embodiment of the present invention will be described with reference to the drawings. A magnetic field detecting element according to the present embodiment can be suitably used particularly as the read head portion of a thin film magnetic head of a hard disk device. FIG. 3 is a sectional view illustrating the main portion of a thin film magnetic head in which the magnetic field detecting element according to the present embodiment is employed. FIG. 4 is an enlarged view illustrating the air bearing surface of the magnetic field detecting element of the thin film magnetic head shown in FIG. 3. The air bearing surface is a surface of the thin film magnetic head which faces a recording medium.

Thin film magnetic head 9 has magnetic field detecting element 1 and write head portion 2. Magnetic field detecting element 1 is sandwiched between upper shield electrode layer 3 and lower shield electrode layer 4 that is formed on substrate 91, with the tip end thereof exposed on air bearing surface ABS. Magnetic field detecting element 1 is configured to allow a sense current to flow in direction P that is perpendicular to the film surface under a voltage that is applied between upper shield electrode layer 3 and lower shield electrode layer 4. A magnetic field of a recording medium (not shown) at a position that faces magnetic field detecting element 1 changes in accordance with the rotation of the recording medium. The change in the magnetic field is detected as a change in electrical resistance based on the magnetoresistance effect. Based on this principle, magnetic field detecting element 1 reads magnetic information written on the recoding medium.

Magnetic field detecting element 1 has stack 5 and a pair of bias magnetic layers 6a, 6b which are provided on both sides of stack 5 with regard to track width direction T. First, the configuration of stack 5 will be described.

Table 1 shows an exemplary layer configuration of stack 5. In the table, the layers are shown in the order of stacking, starting with first pinned layer 51 located on the side of lower shield electrode layer 4 toward second pinned layer 57 located on the side of upper shield electrode layer 3. In the table, the numerals in the column of "Composition" indicate the atomic percents of the elements. Stack 5 has the layer configuration having first pinned layer 51, first exchange coupling transmitting layer 52, first free layer 53, spacer layer 54, second free layer 55, second exchange coupling transmitting layer 56, and second pinned layer 57, which are stacked in this order on lower shield electrode layer 4 that is comprised of a 80Ni20Fe layer having a thickness of about 2 μm. Among these layers, first free layer 53, spacer layer 54 and second free layer 55 constitute sensor region 58 which generate the magnetoresistance effect.

TABLE 1

| Layer Configuration | Composition | Layer Thickness (nm) |
| --- | --- | --- |
| Second pinned layer 57 | 90Co10Fe | 4 |
| Second exchange coupling transmitting layer 56 | Ru | 1.1 |
| Second free layer 55 | 90Co10Fe | 4 |
| Spacer layer 54 | ZnO or MgO | 1.2(ZnO) 0.5(MgO) |
| First free layer 53 | 90Co10Fe | 4 |
| First exchange coupling transmitting layer 52 | Cu | 0.9 |
| First pinned layer 51 | CoFe | 6 |

First and second free layers 53, 55 are magnetic layers whose magnetization directions change in accordance with an external magnetic field. First and second free layers 53, 55 are made of 90Co10Fe, but they may also be made of NiFe, CoFeB, or may be comprised of two layers consisting of CoFe/NiFe.

Spacer layer 54 is a non-magnetic layer that is sandwiched between first and second free layers 53, 55. In the example shown in Table 1, ZnO or MgO is used for spacer layer 54. As will be described later, first and second free layers 53, 55 are exchange-coupled to first pinned layer 51 and second pinned layer 57, respectively, and no exchange coupling preferably occurs between first and second free layers 53, 55. This feature is different from a conventional magnetic field detecting element having two free layers in which first and second free layers are exchange-coupled to each other. For this reason, it is not desirable that any material that exhibits a high exchange coupling strength, such as Cu, be used for spacer layer 54. ZnO and MgO satisfy such a requirement, and hence are suitably used for spacer layer 54 in the present embodiment. Examples of other materials which can be suitably used for spacer layer 54 include $Al_2O_3$, AlN, $TiO_2$, and NiO. When a metal or a semiconductor, such as ZnO, is used for spacer layer 54, magnetic field detecting element 1 functions as a CPP-GMR element. Alternatively, when an insulator, such as MgO, is used, magnetic field detecting element 1 functions as a TMR element.

First exchange coupling transmitting layer 52 is provided adjacent to surface 532 of first free layer 53, wherein surface 532 is opposite to surface 531 of first free layer 53 that is adjacent to spacer layer 54. First pinned layer 51 is provided such that first pinned layer 51 and first free layer 53 sandwich first exchange coupling transmitting layer 52. First free layer 53 is exchange-coupled to first pinned layer 51 via first exchange coupling transmitting layer 52. Similarly, second exchange coupling transmitting layer 56 is provided adjacent to surface 552 of second free layer 55, wherein surface 552 is opposite to surface 551 of second free layer 55 that is adjacent to spacer layer 54. Second pinned layer 57 is provided such that second pinned magnetization layer 57 and second free layer 55 sandwich second exchange coupling transmitting layer 56. Second free layer 55 is exchange-coupled to second pinned layer 57 via second exchange coupling transmitting layer 56.

First and second exchange coupling transmitting layers 52, 56 are similar to each other in that both layers 52, 56 generate exchange coupling. However, first exchange coupling transmitting layer 52 has a negative exchange coupling strength, while second exchange coupling transmitting layer 56 has a positive exchange coupling strength. The reason will be described later. The absolute value of the exchange coupling strength of each layer is preferably not less than $0.02 \times 10^{-11}$ [$J/m^2$] (0.02 erg/cm$^2$). If the absolute value is less than this value, then first and second free layers 53, 55 tend to be magnetized into more than one magnetic domain, thereby easily causing the Barkhousen noise. Also, the absolute value of the exchange coupling strength of each layer is preferably not more than $0.6 \times 10^{-11}$ [$J/m^2$] (0.6 erg/cm$^2$). If the absolute value is more than this value, then the magnetization of first and second free layers 53, 55 cannot freely respond to a signal magnetic field of the recording medium, thereby degrading sensitivity. A wide variety of metals which generate exchange coupling can be employed for first and second exchange coupling transmitting layers 52, 56. Metals, such as copper (Cu), ruthenium (Ru), rhodium (Rh), iridium (Ir), gold (Au), and silver (Ag), are included in these metals. First and second exchange coupling transmitting layers 52, 56 may be made of the same material or may be made of different materials.

Figure 5:
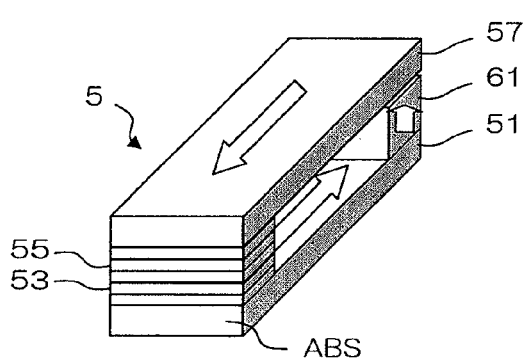
FIG. 5 is a schematic perspective view illustrating an arrangement to fix the magnetization of the first and second pinned layers in anti-parallel directions.

First and second pinned layers 51, 57, which are made of a CoFe layer or the like, are magnetized in directions that are perpendicular to air bearing surface ABS and that are antiparallel with each other, as shown in FIG. 5. In the figure, the arrows indicate the directions of magnetization. In the illustrated example, first pinned layer 51 is magnetized in the direction that runs along the element height (MRH) from air bearing surface ABS, while second pinned layer 57 is magnetized in the direction that runs from air bearing surface ABS toward the recording medium. In order to magnetize first and second pinned layers 51, 57 in these directions, perpendicularly magnetized film 61, which is made of FePt or the like, is provided. The film is sandwiched between first and second pinned layers 51, 57 at a location that is apart from first and second free layers 53, 55. This configuration allows first and second pinned layers 51, 57 to form a U-shaped magnet, which provides the magnetization state described above, in conjunction with perpendicularly magnetized film 61. Perpendicularly magnetized film 61 is insulated from stack 5 in order to prevent sense current from flowing through perpendicularly magnetized film 61.

Figure 6:
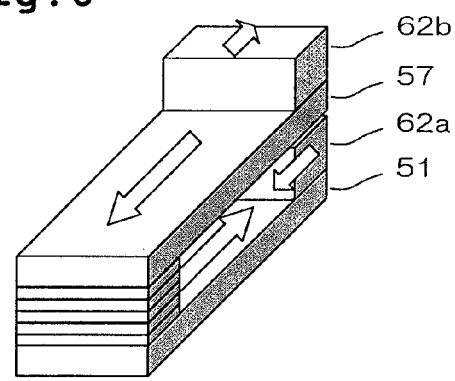
FIG. 6 is a schematic perspective view illustrating another arrangement to fix the magnetization of the first and second pinned layers in anti-parallel direction.

First and second pinned layers 51, 57 may also be magnetized by first and second antiferromagnetic layers 62a, 62b, which are made of IrMn or the like, at locations that are apart from first and second free layers 53, 55, as shown in FIG. 6.

First pinned layer 51 has a larger magnetic film thickness (a product of a saturation magnetization and a film thickness) than first exchange coupling transmitting layer 52.

Referring to FIG. 4, a pair of bias magnetic layers 6a, 6b, which apply a bias magnetic field to first and second free layers 53, 55 via insulating layers 7a, 7b, are provided on both sides of stack 5 with regard to track width direction T. Bias magnetic layers 6a, 6b are hard magnetic films that are made of CoPt, CoCrPt, or the like. It is not always necessary for bias magnetic layers 6a, 6b to be formed over the entire height of stack 5 on both sides of stack 5 in track width direction T. However, it is desirable that bias magnetic layers 6a, 6b be provided on both sides of at least first and second free layers 53, 55 with regard to track width direction T. Insulating layers 7a, 7b prevent sense current from flowing through bias magnetic layers 6a, 6b.

Referring again to FIG. 3, write head portion 2 is provided above magnetic field detecting element 1 via inter-element shield layer 8 that is formed by means of sputtering or the like. Write head portion 2 has an arrangement for so-called perpendicular magnetic recording. Magnetic pole layers for writing have main magnetic pole layer 21 and auxiliary magnetic pole layer 22. These magnetic pole layers 21, 22 are formed by frame plating or the like. Main magnetic pole layer 21, which is made of FeCo, is exposed on air bearing surface ABS substantially perpendicularly thereto. Coil layer 23, which extends above gap layer 24 made of an insulating material, is wound around main magnetic pole layer 21 in order to induce a magnetic flux within main magnetic pole layer 21. Coil layer 23 is formed by means of frame plating or the like. The magnetic flux is guided inside main magnetic pole layer 21 and is emitted from air bearing surface ABS toward the recording medium. Main magnetic pole layer 21 is reduced in dimension not only in direction P that is perpendicular to the film surface but also in track width direction T (i.e., the direction that is perpendicular to the drawing of FIG. 4) in the vicinity of air bearing surface ABS, thereby producing a concentrated and intense writing magnetic field that realizes high recording density.

Auxiliary magnetic pole layer 22 is a magnetic layer that is magnetically coupled to main magnetic pole layer 21. Auxiliary magnetic pole layer 22 is a magnetic pole layer which has a thickness of about 0.01 to about 0.5 µm and which is made of an alloy that consists of any two of Ni, Fe, and Co or three thereof. Auxiliary magnetic pole layer 22 is branched from main magnetic pole layer 21 and is provided opposite to main magnetic pole layer 21 via gap layer 24 and coil insulating layer 25 at air bearing surface ABS. Auxiliary magnetic pole layer 22 has a trailing shield portion having a wider layer section than the rest of auxiliary magnetic pole layer 22 at the end portion that is on the side of air bearing surface ABS. Auxiliary magnetic pole layer 22 having such an arrangement provides a steeper magnetic field gradient between auxiliary magnetic pole layer 22 and main magnetic pole layer 21 in the vicinity of air bearing surface ABS. As a result, it is possible to reduce signal output jitter, thereby to lower the error rate in reading.

Insulating layers 92, 93 are formed in the portion in which magnetic field detecting element 1 and write head portion 2 described above are not provided.

Figure 7A:
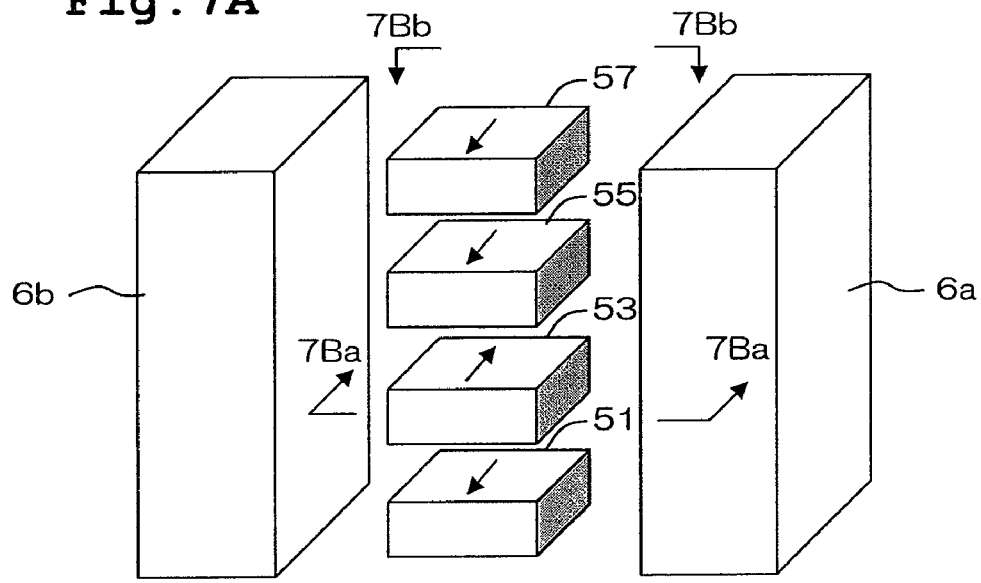
FIGS. 7A and 7B are schematic conceptual views illustrating magnetization of the first and second free layers and the first and second pinned layers of the magnetic field detecting element shown in FIG. 3.
Figure 7B:
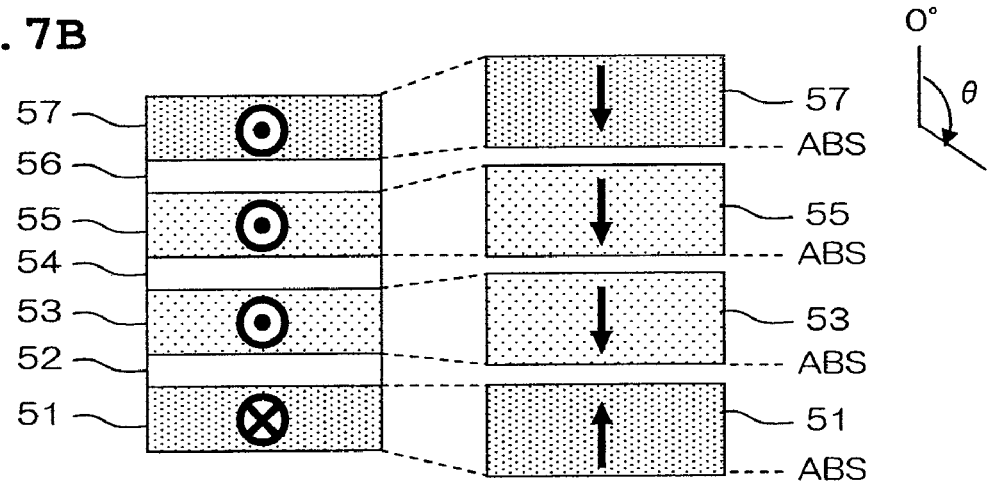

Description will be made of the operating principle of above-described magnetic field detecting element 1. First, suppose a hypothetical condition in which no bias magnetic field is applied, i.e., a condition in which bias magnetic layers 6a, 6b are not provided. It is also assumed that any external magnetic field is not applied from the recording medium. FIG. 7A is a schematic perspective view illustrating the magnetization states of first and second free layers 53, 55, as well as first and second pinned layers 51, 57, under this condition. FIG. 7B is a view separately illustrating the magnetization direction of each layer described above, wherein the left portion is a side view illustrating the magnetization state of each layer, as viewed from direction 7Ba-7Ba shown in FIG. 7A (i.e., viewed from the side of the air bearing surface), and the right portion is a plan view illustrating the magnetization state of each layer, as viewed from direction 7Bb-7Bb (i.e., viewed from above with regard to the direction of stacking). As described above, first pinned layer 51 is magnetized in the direction that runs along the element height (MRH) from air bearing surface ABS, while second pinned layer 57 is magnetized in the direction that runs from air bearing surface ABS toward the recording medium. Both first and second free layers 53, 55 are magnetized in the same direction as second pinned layer 57 is magnetized. In the plan view in the right portion of FIG. 7B, if angle θ is defined such that it corresponds to 0 degrees when it is directed towards the top of the figure and if it increases clockwise, then first pinned layer 51 is magnetized in the direction of 0 degrees in angle θ, while first and second free layers 53, 55 and second pinned layer 57 are magnetized in the direction of 180 degrees in angle θ. These directions correspond to the direction that is perpendicular to air bearing surface ABS because first and second pinned layers 51, 57 are magnetized in the directions that are perpendicular to air bearing surface ABS.

Figure 8A:
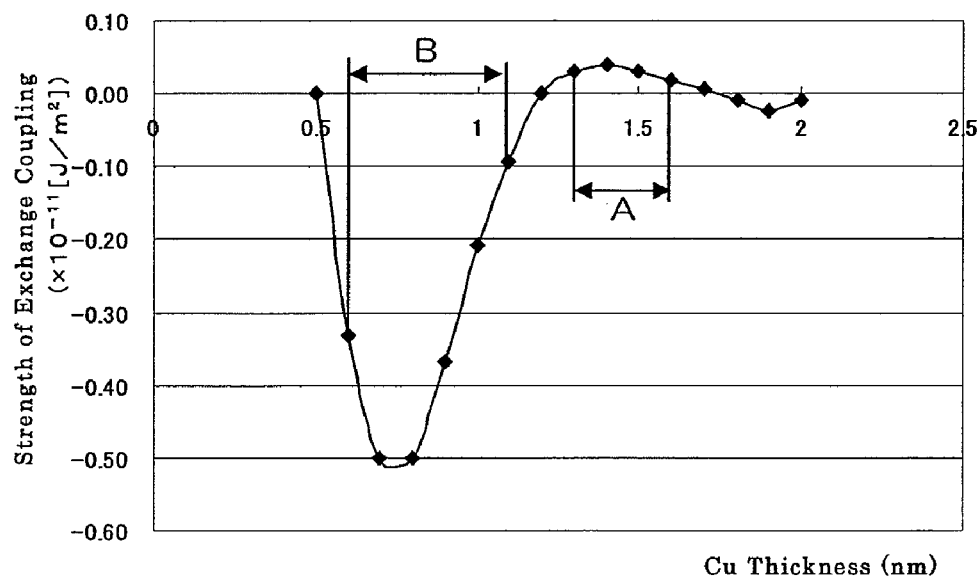
FIGS. 8A and 8B are graphs showing the exchange coupling strength of Cu and the exchange coupling strength of Ru, respectively.
Figure 8B:
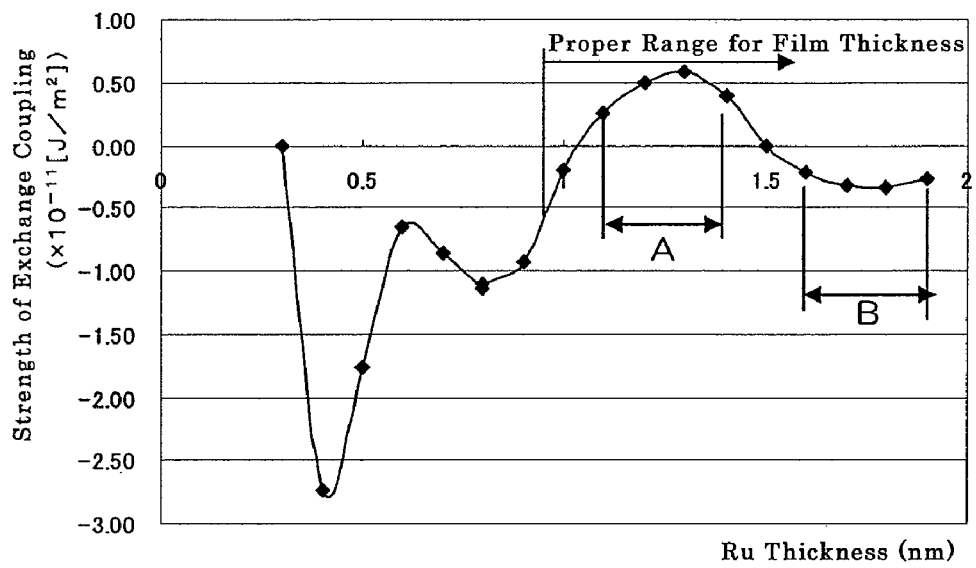

The reason why first free layer 53 is magnetized in a direction that is anti-parallel to first pinned layer 51 and why second free layer 53 is magnetized in parallel with second pinned layer 57 is because that first exchange coupling transmitting layer 52 has a negative exchange coupling strength and second exchange coupling transmitting layer 56 has a positive exchange coupling strength, as described above. FIGS. 8A and 8B are graphs showing the exchange coupling strength of Cu and the exchange coupling strength of Ru, respectively, as a function of film thicknesses. It is known that these materials exhibit a positive or negative exchange coupling strength depending on the film thickness. As can be seen, Cu, for instance, exhibits a positive exchange coupling strength when the film thickness is within the range from 1.3 to 1.6 nm (indicated as A in the figure). Therefore, by providing a Cu layer having a film thickness from 1.3 to 1.6 nm as second exchange coupling transmitting layer 56, second free layer 55 can be magnetized in parallel with second pinned layer 57. On the other hand, by providing a Cu layer having a film thickness from 0.6 to 1.1 nm (indicated as B in the figure) as first exchange coupling transmitting layer 52, first free layer 53 can be magnetized in a direction that is anti-parallel to first exchange coupling transmitting layer 51. Similarly, when Ru is used, the film thickness is preferably not less than 0.95 nm in order to limit the absolute value of the exchange coupling strength within $0.6 \times 10^{-11}$ [$J/m^2$], and a positive exchange coupling strength can be obtained when the film thickness is, for example, within the range from 1.1 to 1.4 nm (indicated as A in the figure), and a negative exchange coupling strength can be obtained when the film thickness is within the range from 1.6 to 2.0 nm (indicated as B in the figure) It should be noted that magnetization of first and second free layers 53, 55 only depends on exchange coupling with first and second pinned layers 51, 57, respectively, because spacer layer 54 has an exchange coupling strength that is equal to zero or that is negligible.

Figure 9A:
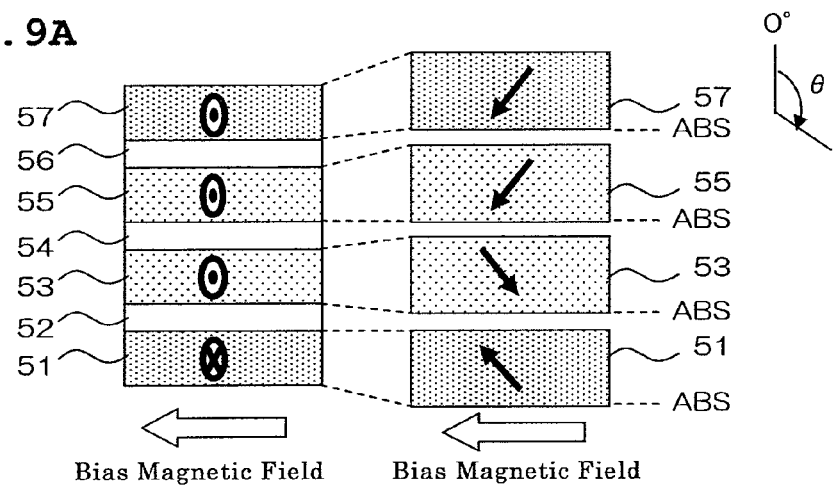
FIGS. 9A to 9C are schematic conceptual views illustrating magnetization of the first and second free layers and the first and second pinned layers of the magnetic field detecting element shown in FIG. 3 when a bias magnetic field and an external magnetic field are applied.

Next, assume that a bias magnetic field is applied in the leftward direction in the figure under this hypothetical condition, as shown in FIG. 9A. Second free layer 55 and second pinned layer 57, which are magnetized in parallel with each other, are both magnetized in the direction of the bias magnetic field when the leftward bias magnetic field is applied. Specifically, the magnetization directions of second free layer 55 and second pinned layer 57 are rotated clockwise. The magnitude of the bias magnetic field is most preferably adjusted such that angle θ is about 225 degrees.

On the other hand, first free layer 53 and first pinned layer 51, which are magnetized in directions that are different from each other, are magnetized in the following manner, unlike second free layer 55 and second pinned layer 57. First free layer 53, which is magnetized in the direction of 180 degrees, is subjected to a force that magnetizes first free layer 53 in the clockwise direction toward 270 degrees when the leftward bias magnetic field is applied. On the other hand, first pinned layer 51, which is magnetized in the direction of 0 degrees, is subjected to a force that magnetizes first pinned layer 51 in the counterclockwise direction toward 270 degrees when the leftward bias magnetic field is applied. However, first pinned layer 51 and first free layer 53 are not magnetized independently of each other when the bias magnetic field is applied because they are exchange-coupled to each other, and the magnetization directions of first pinned layer 51 and first free layer 53 are changed while they remain exchange-coupled to each other. In this embodiment, since first pinned layer 51 has a larger magnetic film thickness than first free layer 53, first pinned layer 51 is rotated counterclockwise toward the direction of 270 degrees while being accompanied by first free layer 53. However, first free layer 53 is magnetized in a direction that is anti-parallel to first pinned layer 51 due to exchange-coupling with first pinned layer 51. As a result, if first pinned layer 51 is magnetized, for example, in a direction of 315 degrees, then first pinned layer 51 is magnetized in a direction of 135 degrees.

Figure 9B:
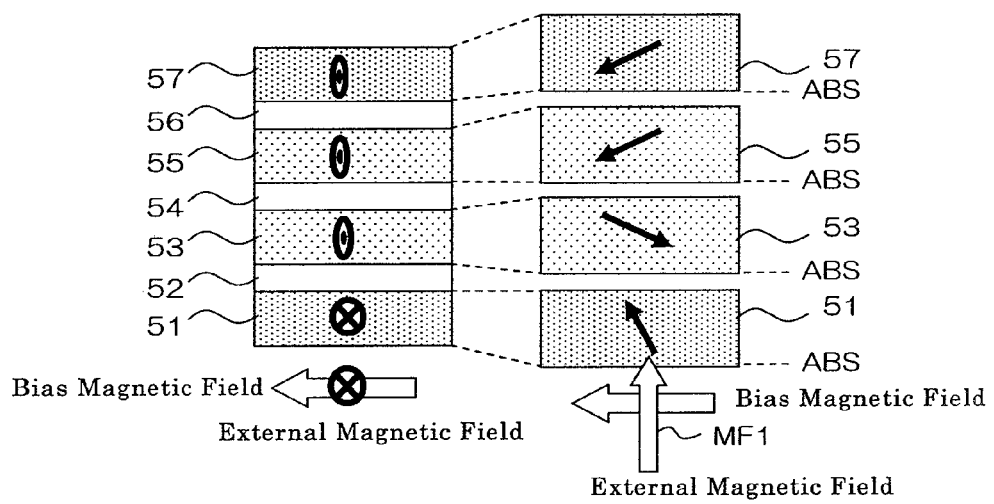
Figure 9C:
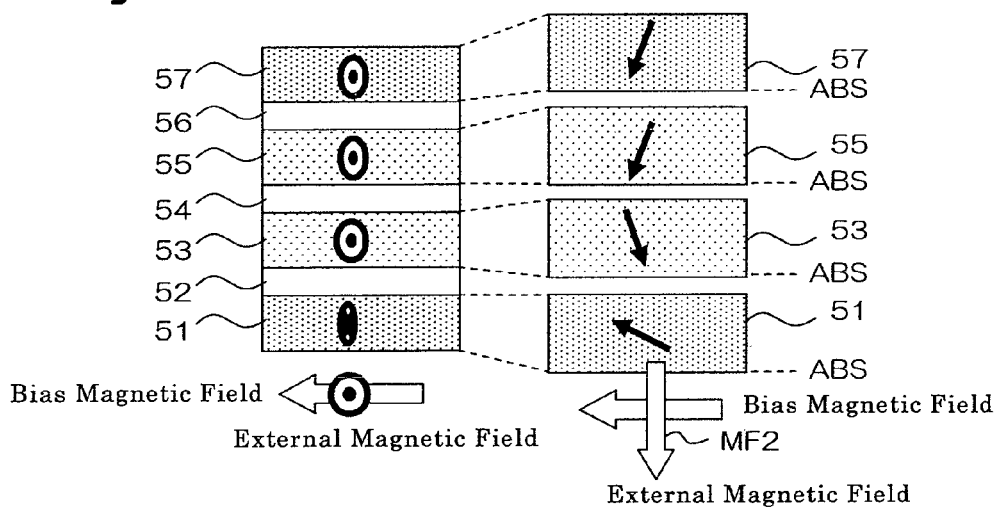

In this state, the first and second free layers are magnetized in directions that are the reverses of each other with respect to the direction that is perpendicular to air bearing surface ABS. The magnetization directions are mirror-symmetric with respect to a line that interconnects 0 degrees and 180 degrees. This state is basically the same as the state shown in FIG. 1B, although the magnetization directions are different. Therefore, when external magnetic field MF1 is applied in the direction that is away from the recording medium, as shown in FIG. 9B, i.e., in the direction toward the top of the figure, two free layers 53, 55 tend to be magnetized in anti-parallel to each other, causing an increase in electrical resistance to the sense current. When external magnetic field MF2 is applied in the direction toward the recording medium, as shown in FIG. 9C, i.e., in the direction toward the bottom of the figure, two free layers 53, 55 tend to be magnetized in parallel to each other, causing an decrease in electrical resistance to the sense current. In this way, the direction and magnitude of the external magnetic field can be detected as a change in electrical resistance to the sense current.

The present embodiment has the following advantages. First, since there is no need to provide a stack with an antiferromagnetic layer and a synthetic pinned layer, the gap between upper shield electrode layer 3 and lower shield electrode layer 4 can be easily reduced, and thereby further improvement of the linear recording density can be obtained. In a conventional CPP element, it is only the inner pinned layer that directly contributes to a change in the magnetoresistance in the synthetic pinned layer. The outer pinned layer and the antiferromagnetic layer do not contribute to the change in the magnetoresistance, but rather serve as a factor that may impede an improvement in the magnetoresistance ratio. However, the present embodiment does not require an outer pinned layer and an antiferromagnetic layer, and hence enables a reduction in parasitic resistance, thus providing potential for a further improvement in the magnetoresistance ratio. Further, since the bias magnetic layers are provided on both sides of the first and second free layers with regard to the track width direction, a bias magnetic field can be effectively applied. Accordingly, the linear change in resistance to an external magnetic field can be enhanced, and at the same time, the Barkhousen noise can be effectively limited.

The magnetic field detecting element according to the present embodiment can be fabricated by the following method. First, lower shield electrode layer 4 is formed on substrate 91, and layers that form stack 5 are formed on lower shield electrode layer 4 by means of sputtering. Subsequently, these layers are formed into stack 5 by patterning, and perpendicularly magnetized film 61 is formed at the back of stack 5 by means of frame plating or the like. Thereafter, portions above lower shield electrode layer 4 in which the layers mentioned above are not formed are filled with insulating layers, and bias magnetic layers 6a, 6b are formed on both sides of stack 5 with regard to track width direction T via insulating layers 7a, 7b. Thereafter, upper shield electrode layer 3 is formed.

According to the present embodiment explained above, first pinned layer 51 is magnetized in the direction of 0 degrees, while first and second free layers 53, 55 and second pinned layer 57 are magnetized in the direction of 180 degrees, as shown in FIG. 9A. However, four types, in total, of magnetization directions of these layers are possible, as shown in FIGS. 10A to 10C, including the embodiment shown in FIG. 9A.

Figure 10A:
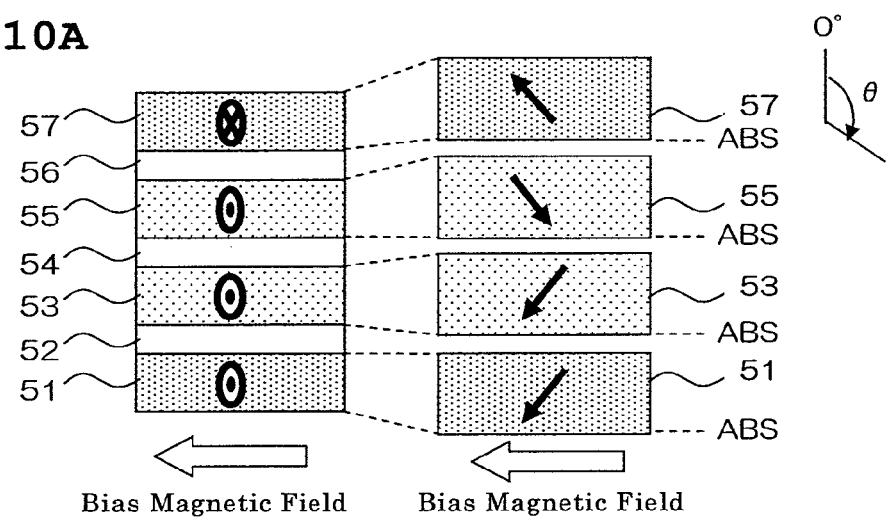
FIGS. 10A to 10C are schematic conceptual views showing magnetization patterns of the first and second free layers and the first and second pinned layers other than the magnetization pattern shown in FIG. 3.

FIG. 10A shows a pattern in which second pinned layer 57 is magnetized in the direction of 0 degrees and in which first and second free layers 53, 55, as well as first pinned layer 51, are magnetized in the direction of 180 degrees. In order to obtain this pattern, the magnetization direction of first and second pinned layers 51, 57 are reversed by magnetizing perpendicularly magnetized film 61 in the direction toward the bottom of the figure, which is opposite to the direction in FIG. 5. Subsequently, the material and the thicknesses of first and second exchange coupling transmitting layers 52, 56 are set such that second free layer 55 and second pinned layer 57 are exchange-coupled to each other in an anti-parallel direction and such that first free layer 53 and first pinned layer 51 are exchange-coupled to each other in a parallel direction. Further, the material and the thicknesses of second pinned layer 57 and second free layer 55 are set such that second pinned layer 57 has a larger magnetic film thickness than second free layer 55.

Figure 10B:
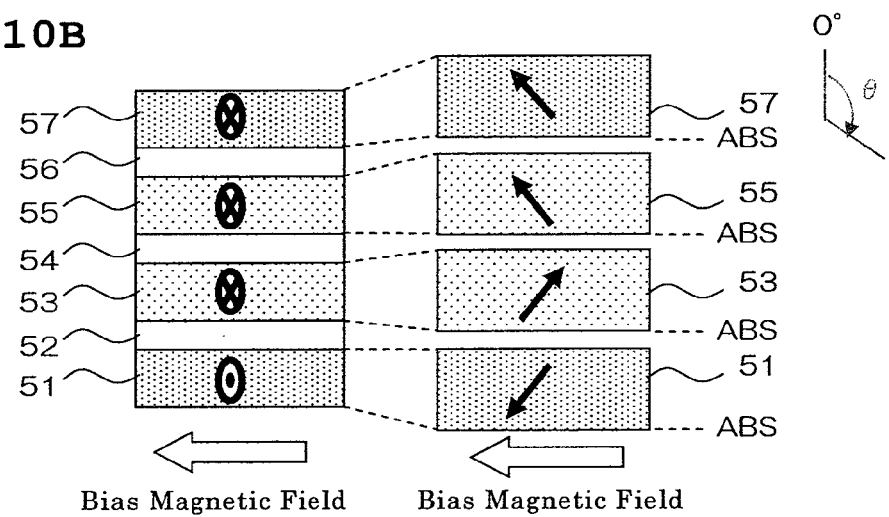

FIG. 10B shows a pattern in which the magnetization directions of first and second free layers 53, 55 are opposite to those shown in FIG. 10A. Pinned layer 51 is magnetized in the direction of 180 degrees, while first and second free layers 53, 55, as well as second pinned layer 57, are magnetized in the direction of 0 degrees. In order to obtain this pattern, perpendicularly magnetized film 61 which is magnetized as shown in FIG. 5 is magnetized in the direction toward the bottom of the figure, in the same manner as in FIG. 1A. Subsequently, the material and the thicknesses of first and second exchange coupling transmitting layers 52, 56 are determined such that second free layer 55 and second pinned layer 57 are exchange-coupled to each other in a parallel direction and such that first free layer 53 and first pinned layer 51 are exchange-coupled to each other in an anti-parallel direction. Further, the material and the thicknesses of first pinned layer 51 and first free layer 53 are determined such that first pinned layer 51 has a larger magnetic film thickness than first free layer 53.

Figure 10C:
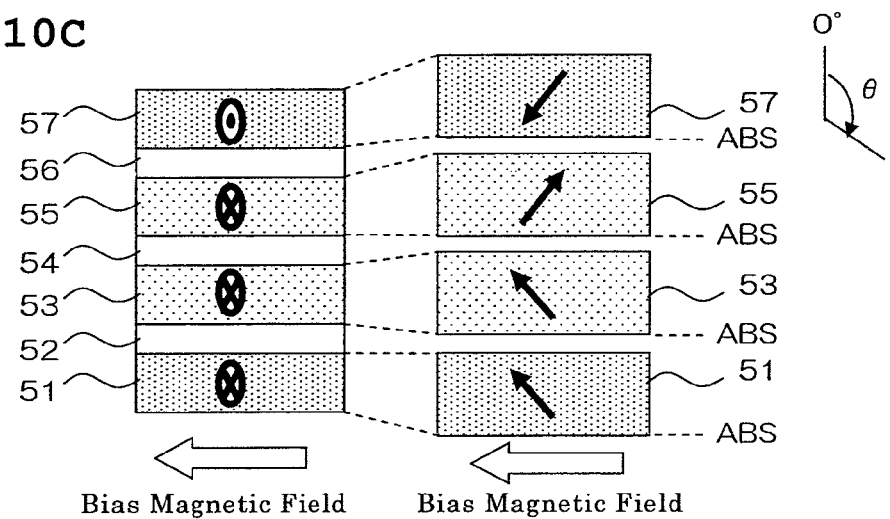

FIG. 10C shows a pattern in which second pinned layer 57 is magnetized in the direction of 180 degrees while first and second free layers 53, 55, as well as first pinned layer 51, are magnetized in the direction of 0 degrees. In order to obtain this pattern, perpendicularly magnetized film 61 which is magnetized as shown in FIG. 5 is magnetized in the direction toward the top of the figure, in the same manner as in FIG. 9A. Subsequently, the material and the thicknesses of first and second exchange coupling transmitting layers 52, 56 are determined such that second free layer 55 and second pinned layer 57 are exchange-coupled to each other in an anti-parallel direction and such that first free layer 53 and first pinned layer 51 are exchange-coupled to each other in a parallel direction. Further, the material and the thicknesses of second pinned layer 57 and second free layer 55 are determined such that second pinned layer 57 has a larger magnetic film thickness than second free layer 55.

In summary, first and second pinned layers 51, 57 are magnetized in directions that are anti-parallel to each other, and the material and the thickness of each layer are determined such that first pinned layer 51 or second pinned 57, which is located adjacent to first exchange coupling transmitting layer 52 or second exchange coupling transmitting layer 56 having a negative exchange coupling strength, has a larger magnetic film thickness than first free layer 53 or second free layer 55, which is located adjacent to said first exchange coupling transmitting layer 52 or said second exchange coupling transmitting layer 56 having the negative exchange coupling strength.

Figure 11:
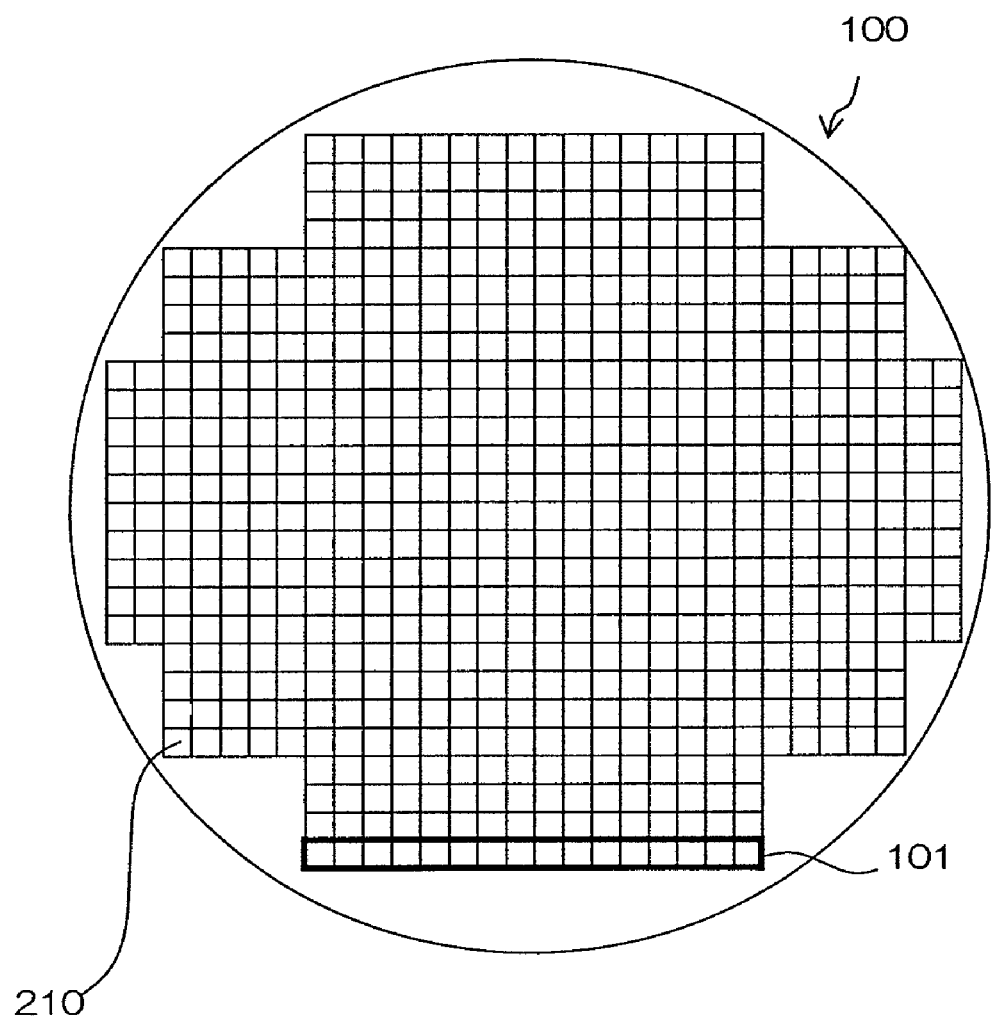
FIG. 11 is a plan view of a wafer which is used to manufacture the magnetic field detecting element of the present invention.

Next, explanation will be made regarding a wafer for fabricating a magnetic field detecting element described above. FIG. 11 is a schematic plan view of a wafer. Wafer 100 has a stack deposited thereon that constitutes at least the magnetic field detecting element 9 described above. Wafer 100 is diced into bars 101 which serve as working units in the process of forming air bearing surface ABS. After lapping, bar 101 is diced into sliders 210 which include thin-film magnetic heads 9. Dicing portions, not shown, are provided in wafer 100 in order to dice wafer 100 into bars 101 and into sliders 210.

Figure 12:
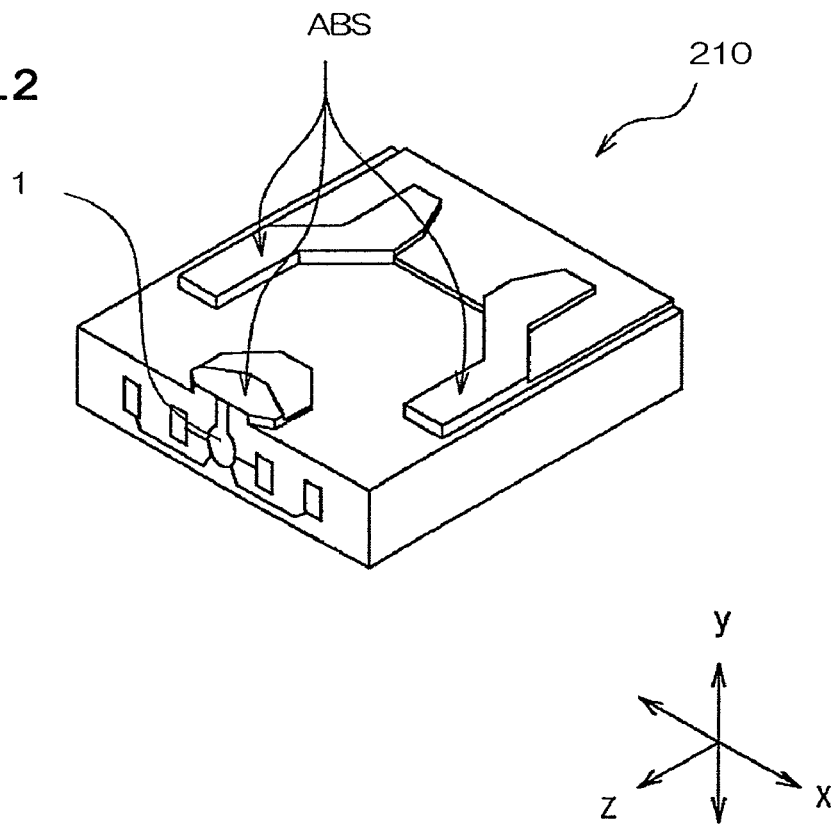
FIG. 12 is a perspective view of a slider of the present invention.

Referring to FIG. 12, slider 210 has a substantially hexahedral shape. One surface out of six the surfaces of slider 210 forms air bearing surface ABS, which is positioned opposite to the hard disk.

Figure 13:
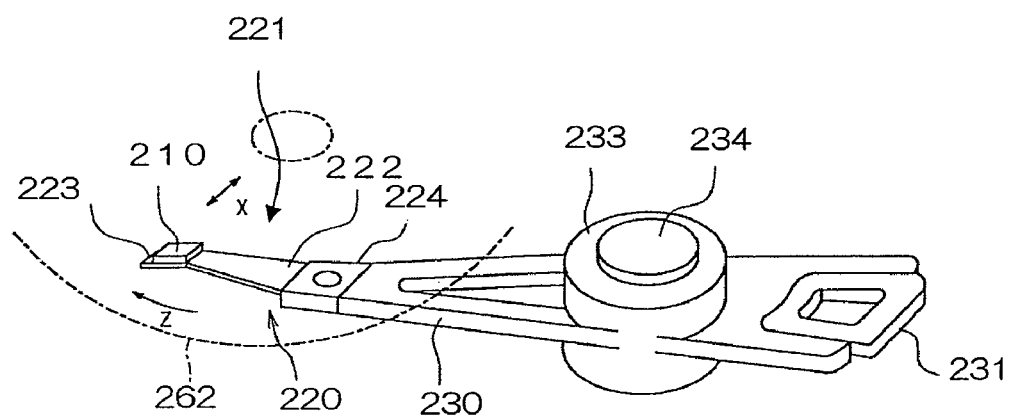
FIG. 13 is a perspective view of a head arm assembly which includes a head gimbal assembly which incorporates a slider of the present invention.

Referring to FIG. 13, head gimbal assembly 220 has slider 210 and suspension 221 for resiliently supporting slider 210. Suspension 221 has load beam 222 in the shape of a flat spring and made of, for example, stainless steel, flexure 223 that is attached to one end of load beam 222, and base plate 224 provided on the other end of load beam 222. Slider 210 is fixed to flexure 223 to provide slider 210 with an appropriate degree of freedom. The portion of flexure 223 to which slider 210 is attached has a gimbal section for maintaining slider 210 in a fixed orientation.

Slider 210 is arranged opposite to a hard disk, which is a rotationally-driven disc-shaped storage medium, in a hard disk drive. When the hard disk rotates in the z direction shown in FIG. 13, airflow which passes between the hard disk and slider 210 creates a dynamic lift, which is applied to slider 210 downward in the y direction. Slider 210 is configured to lift up from the surface of the hard disk due to this dynamic lift effect. Magnetic field detecting element 1 is formed in proximity to the trailing edge (the end portion at the lower left in FIG. 12) of slider 210, which is on the outlet side of the airflow.

The arrangement in which a head gimbal assembly 220 is attached to arm 230 is called a head arm assembly 221. Arm 230 moves slider 210 in transverse direction x with regard to the track of hard disk 262. One end of arm 230 is attached to base plate 224. Coil 231, which constitutes a part of a voice coil motor, is attached to the other end of arm 230. Bearing section 233 is provided in the intermediate portion of arm 230. Arm 230 is rotatably held by shaft 234 which is attached to bearing section 233. Arm 230 and the voice coil motor to drive arm 230 constitute an actuator.

Figure 14:
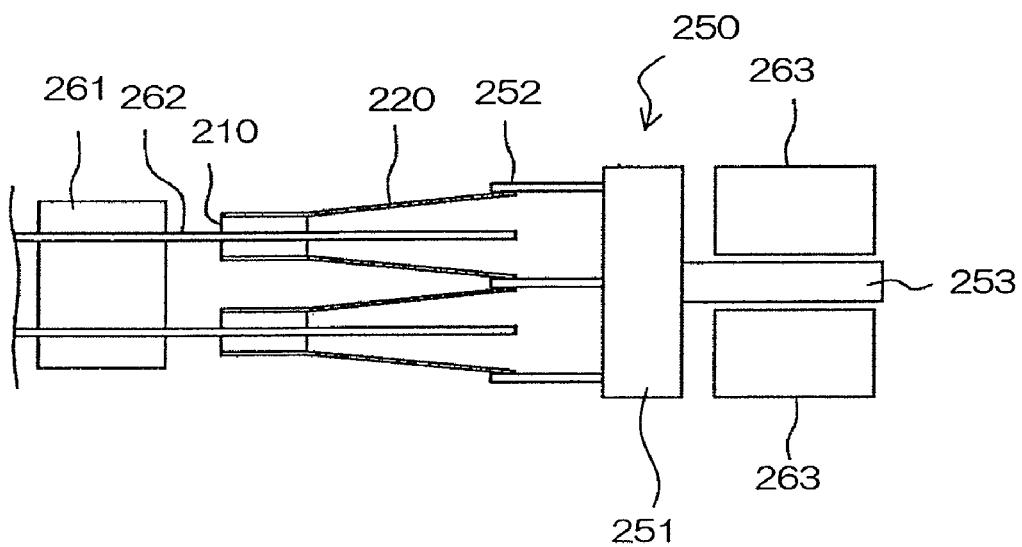
FIG. 14 is a side view of a head arm assembly which incorporates sliders of the present invention.
Figure 15:
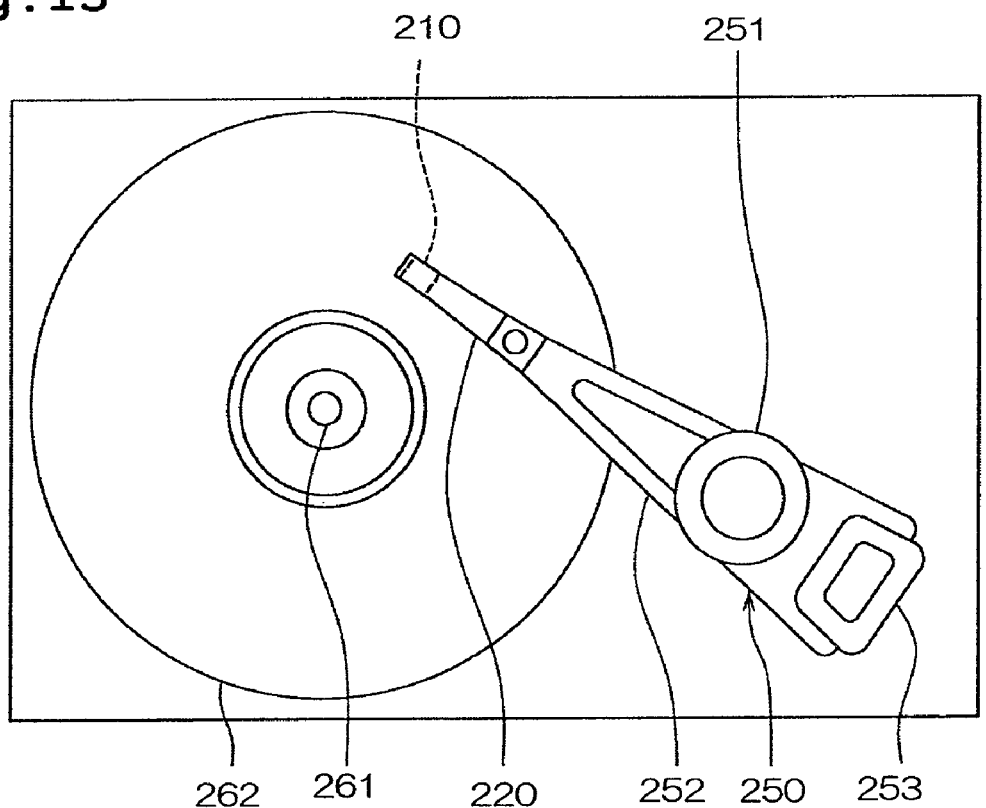
FIG. 15 is a plan view of a hard disk drive which incorporates sliders of the present invention.

Referring to FIG. 14 and FIG. 15, a head stack assembly and a hard disk drive that incorporate the slider mentioned above will be explained next. The arrangement in which head gimbal assemblies 220 are attached to the respective arm of a carriage having a plurality of arms is called a head stack assembly. FIG. 14 is a side view of a head stack assembly, and FIG. 15 is a plan view of a hard disk drive. Head stack assembly 250 has carriage 251 provided with a plurality of arms 252. Head gimbal assemblies 220 are attached to arms 252 such that head gimbal assemblies 220 are arranged apart from each other in the vertical direction. Coil 253, which constitutes a part of the voice coil motor, is attached to carriage 251 on the side opposite to arms 252. The voice coil motor has permanent magnets 263 which are arranged in positions that are opposite to each other and interpose coil 253 therebetween.

Referring to FIG. 15, head stack assembly 250 is installed in a hard disk drive. The hard disk drive has a plurality of hard disks which are connected to spindle motor 261. Two sliders 210 are provided per each hard disk 262 at positions which are opposite to each other and interpose hard disk 262 therebetween. Head stack assembly 250 and the actuator, except for sliders 210, work as a positioning device in the present invention. They carry sliders 210 and work to position sliders 210 relative to hard disks 262. Sliders 210 are moved by the actuator in the transverse direction with regard to the tracks of hard disks 262, and positioned relative to hard disks 262. Magnetic field detecting element 1 that is included in slider 210 writes information to hard disk 262 by means of the write head portion, and reads information recorded in hard disk 262 by means of the read head portion.

Although certain preferred embodiments of the present invention have been shown and described in detail, it should be understood that various changes and modifications may be made without departing from the spirit or scope of the appended claims.

What is claimed is:

1. A magnetic field detecting element comprising:
   first and second free layers whose magnetization directions change in accordance with an external magnetic field;
   a spacer layer that is sandwiched between said first and second free layers;
   a first exchange coupling transmitting layer 52 that is located adjacent to a surface of first free layer 53, said surface of first free layer 53 being opposite to a surface of said first free layer 53 which is located adjacent to said spacer layer;
   a first pinned layer 51 which is provided such that said first pinned layer and said first free layer 53 sandwich first exchange coupling transmitting layer 52 and which is exchange-coupled to first free layer 53 via said first exchange coupling transmitting layer 52;
   a second exchange coupling transmitting layer that is located adjacent to a surface of said second free layer, said surface of said second free layer being opposite to a surface of said second free layer which is located adjacent to said spacer layer;
   a second pinned layer which is provided such that said second pinned layer and said second free layer sandwich said second exchange coupling transmitting layer and which is exchange-coupled to said second free layer via said second exchange coupling transmitting layer; and a pair of bias magnetic layers which are provided on both sides of at least said first and second free layers with regard to a track width direction thereof, said pair of bias magnetic layers applying a bias magnetic field to said first and second free layers, wherein:

said first and second pinned layers are magnetized in directions which are perpendicular to an air bearing surface and which are anti-parallel with each other, respectively;

said first exchange coupling transmitting layer or second exchange coupling transmitting layer has a positive exchange coupling strength, while the other has a negative exchange coupling strength; and said first or second pinned layer that is located adjacent to said first or second exchange coupling transmitting layer having the negative exchange coupling strength has a larger magnetic film thickness than said first or, second free layer that is located adjacent to said first or second exchange coupling transmitting layer having the negative exchange coupling strength.

2. The magnetic field detecting element according to claim 1, wherein an absolute value of the exchange coupling strength of said first and second exchange coupling transmitting layers is within a range that is not less than $0.02 \times 10^{-11}$ [J/m$^2$] and that is not more than $0.6 \times 10^{-11}$ [J/m$^2$].

3. The magnetic field detecting element according to claim 2, wherein at least either said first or second exchange coupling transmitting layers is made of copper.

4. The magnetic field detecting element according to claim 2, wherein at least either said first or second exchange coupling transmitting layers is made of ruthenium.

5. The magnetic field detecting element according to claim 1, wherein said spacer layer is made of ZnO or MgO.

6. The magnetic field detecting element according to claim 1, wherein said first and second pinned layers are magnetized by a perpendicularly magnetized film that is sandwiched therebetween, at a location that is apart from said first and second free layers.

7. The magnetic field detecting element according to claim 1, wherein said first and second pinned layers are magnetized by first and second antiferromagnetic layers, respectively, at locations that are apart from said first and second free layers.

8. A slider that is provided with the magnetic field detecting element according to claim 1.

9. A head gimbals assembly which has the slider according to claim 8 and a suspension for elastically supporting the slider.

10. A hard disc drive which includes the slider according to claim 8 and a device for supporting the slider and for positioning the slider with respect to a recording medium.

11. A wafer which has a stack formed thereon, wherein said stack is to be formed into the magnetic field detecting element according to claim 1.

* * * * *